United States Patent [19]

Eriksson et al.

[11] Patent Number: 5,033,082
[45] Date of Patent: Jul. 16, 1991

[54] COMMUNICATION SYSTEM WITH ACTIVE NOISE CANCELLATION

[75] Inventors: Larry J. Eriksson, Madison; Mark C. Allie, Oregon, both of Wis.

[73] Assignee: Nelson Industries, Inc., Stoughton, Wis.

[21] Appl. No.: 388,014

[22] Filed: Jul. 31, 1989

[51] Int. Cl.⁵ .......................... H04B 3/23; H04B 15/00
[52] U.S. Cl. .................................. 379/410; 379/388; 379/392; 381/71; 381/94
[58] Field of Search .................... 381/71, 94; 379/388, 379/392, 410, 411

[56] References Cited

U.S. PATENT DOCUMENTS

| | | | |
|---|---|---|---|
| 4,153,815 | 5/1979 | Chaplin et al. | 381/71 |
| 4,417,098 | 11/1983 | Chaplin et al. | 381/71 X |
| 4,473,906 | 9/1984 | Warnaka et al. | 381/71 |
| 4,566,118 | 1/1986 | Chaplin et al. | 381/71 |
| 4,589,137 | 5/1986 | Miller | 381/71 X |
| 4,625,083 | 11/1986 | Poikela | 381/71 X |
| 4,636,586 | 1/1987 | Schiff | 381/71 X |
| 4,649,505 | 3/1987 | Zinser, Jr. et al. | 381/71 X |
| 4,654,871 | 3/1987 | Chaplin et al. | 381/94 X |
| 4,665,549 | 5/1987 | Eriksson et al. | 381/71 |
| 4,672,674 | 6/1987 | Clough et al. | 381/71 |
| 4,677,676 | 6/1987 | Ericksson | 381/71 |
| 4,677,677 | 6/1987 | Eriksson | 381/71 |
| 4,696,030 | 9/1987 | Egobi | 381/94 X |
| 4,736,431 | 4/1988 | Allie et al. | 381/71 |
| 4,757,527 | 7/1988 | Benistor et al. | 379/410 |
| 4,769,847 | 9/1988 | Taguchi | 381/94 |
| 4,815,139 | 3/1989 | Eriksson et al. | 381/71 |
| 4,837,834 | 6/1989 | Allie | 381/71 |
| 4,876,722 | 10/1989 | Dekker et al. | 381/71 |
| 4,912,758 | 3/1990 | Arbel | 379/388 |
| 4,932,063 | 6/1990 | Nakamura | 381/94 |
| 4,935,919 | 6/1990 | Hiraguchi | 379/410 X |

OTHER PUBLICATIONS

"Adaptive Noise Cancelling: Principles and Applications", Widrow et al, Dec. 1975, IEEE.

Primary Examiner—James L. Dwyer
Assistant Examiner—M. Shehata
Attorney, Agent, or Firm—Andrus, Sceales, Starke & Sawall

[57]. ABSTRACT

An active acoustic attenuation system (10) is provided with various adaptive filter models (40, 48, 56, 70, 84, 100) enabling communication between persons (26, 30) in spaced zones (12, 16) by selectively cancelling undesired noise and undesired speech, all on an on-line basis without dedicated off-line pretraining and also for both broadband and narrowband noise.

39 Claims, 1 Drawing Sheet

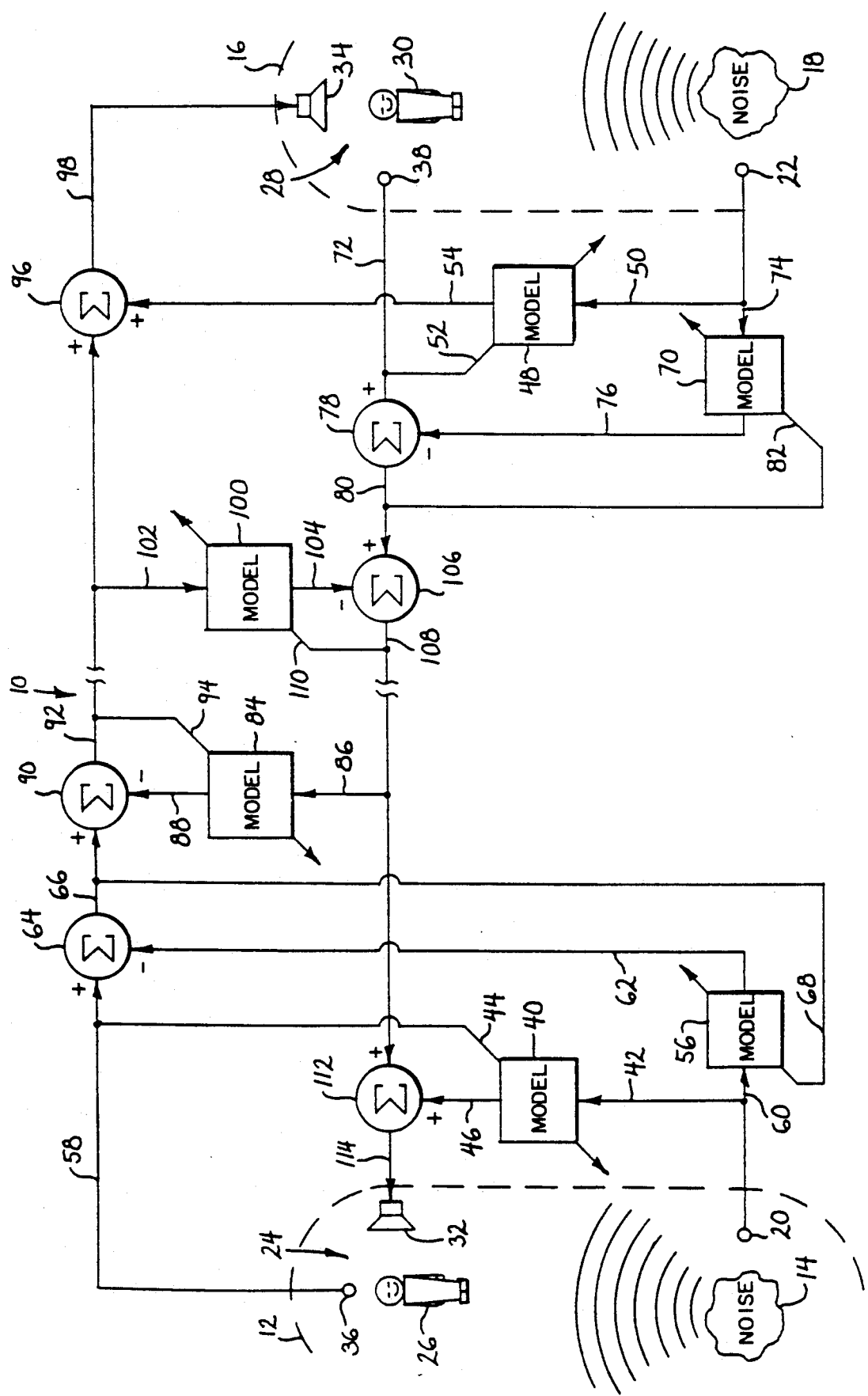

COMMUNICATION SYSTEM WITH ACTIVE NOISE CANCELLATION

BACKGROUND AND SUMMARY

The invention arose during continuing development efforts relating to the subject matter of U.S. Pat. Nos. 4,665,549, 4,677,676, 4,677,677, 4,736,431, 4,815,139, 4,837,834, incorporated herein by reference.

The present invention involves an intercom communication system with active acoustic attenuation. One particularly desirable application of the invention is in magnetic resonance medical imaging systems where the patient is in a noisy environment in the hollow interior tunnel of a cylindrical tubular structure subject to magnetic hum and the like. The patient has difficulty hearing the attending medical technician, and vice versa, and it is thus difficult to communicate instructions, symptoms, etc. Furthermore, the noise adds to the discomfort of the patient who may already be apprehensive of the medical procedure and the claustrophobic tunnel. The present invention cancels the noise and quiets the environment within the tunnel, and also enables communication from the patient to the medical technician, and vice versa.

Another application of the invention is the quieting of the interior of a motor vehicle where the driver or passengers are exposed to noise introduced by the engine, exhaust system, tires, etc. In this environment, the noise is annoying and prevents enjoyment of the vehicle entertainment system and hinders communication with the vehicle via radio telephone. The present invention cancels the noise and and quiets the environment, and also enables enjoyment of the entertainment system and communication to the vehicle via radio telephone, and vice versa.

The invention has numerous other applications where communication is desired in noisy environments.

BRIEF DESCRIPTION OF THE DRAWING

The drawing shows an active acoustic attenuation system in accordance wit the invention.

DETAILED DESCRIPTION

The drawing shows an active acoustic attenuation system 10 having a first zone 12 subject to noise from a noise source 14, and a second zone 16 spaced from zone 12 and subject to noise from a noise source 18. Microphone 20 senses noise from noise source 14. Microphone 22 senses noise from noise source 18. Zone 12 includes a speaking location 24 therein such that a person 26 at location 24 is subject to noise from noise source 14. Zone 16 includes a speaking location 28 therein such that a person 30 at location 28 is subject to noise from noise source 18. Speaker 32 introduces sound into zone 12 at location 24. Speaker 34 introduces sound into zone 16 at location 28. An error microphone 36 senses noise and speech at location 24. Error microphone 38 senses noise and speech at location 28.

An adaptive filter model 40 adaptively models the acoustic path from noise microphone 20 to speaking location 24. Model 40 is preferrably that disclosed in above incorporated U.S. Pat. No. 4,677,676. Adaptive filter model 40 has a model input 42 from noise microphone 20, an error input 44 from error microphone 36, and outputs at output 46 a correction signal to speaker 32 to introduce cancelling sound at location 24 to cancel noise from noise source 14 at location 24, all as in incorporated U.S. Pat. No. 4,677,676.

An adaptive filter model 48 adaptively models the acoustic path from noise microphone 22 to speaking location 28. Model 48 has a model input 50 from noise microphone 22, an error input 52 from error microphone 38, and outputs at output 54 a correction signal to speaker 34 to introduce cancelling sound at location 28 to cancel noise from noise source 18 at location 28.

An adaptive filter model 56 adaptively cancels noise from noise source 14 in the output 58 of error microphone 36. Model 56 has a model input 60 from noise microphone 20, an output correction signal at output 62 subtractively summed at summer 64 with the output 58 of error microphone 36 to provide a sum 66, and an error input 68 from sum 66.

An adaptive filter model 70 adaptively cancels noise from noise source 18 in the output 72 of error microphone 38. Model 70 has a model input 74 from noise microphone 22, an output correction signal at output 76 subtractively summed at summer 78 with the output 72 of error microphone 38 to provide a sum 80, and an error input 82 from sum 80.

An adaptive filter model 84 adaptively cancels speech from person 30 in the output 58 of error microphone 36. Model 84 has a model input 86 from error microphone 38, an output correction signal at output 88 subtractively summed at summer 90 with sum 66 to provide a sum 92, and an error input 94 from sum 92. Sum 92 is additively summed at summer 96 with the output 54 of model 48 to provide a sum 98 which is supplied to speaker 34. Sum 92 is thus supplied to speaker 34 such that person 30 can hear the speech of person 26.

An adaptive filter model 100 adaptively cancels speech from person 26 in the output 72 of error microphone 38. Model 100 has a model input 102 from error microphone 36 at sum 92, an output correction signal at output 104 subtractively summed at summer 106 with sum 80 to provide a sum 108, and an error input 110 from sum 108. Sum 108 is additively summed at summer 112 with the output 46 of model 40 to provide a sum 114 which is supplied to speaker 32. Hence, sum 108 is supplied to speaker 32 such that person 26 can hear the speech of person 30. Model input 86 is provided by sum 108, and model input 102 is provided by sum 92.

Sum 98 supplied to speaker 34 is substantially free of noise from noise source 14 as acoustically and electrically cancelled by adaptive filter models 40 and 56, respectively. Sum 98 is substantially free of speech from person 30 as electrically cancelled by adaptive filter model 84. Hence, sum 98 to speaker 34 is substantially free of noise from noise source 14 and speech from person 30 but does contain speech from person 26, such that speaker 34 cancels noise from noise source 18 at location 28 and introduces substantially no noise from noise source 14 and introduces substantially no speech from person 30 and does introduce speech from person 26, such that person 30 can hear person 26 substantially free of noise from noise sources 14 and 18 and substantially free of his own speech.

Sum 114 supplied to speaker 32 is substantially free of noise from noise source 18 as acoustically and electrically cancelled by adaptive filter models 48 and 70, respectively. Sum 114 is substantially free of speech from person 26 as electrically cancelled by adaptive filter model 100. Sum 114 to speaker 32 is thus substantially free of noise from noise source 18 but does contain speech from person 30, such that speaker 32 cancels noise from noise source 14 at location 24 and introduces substantially no noise from noise source 18 and introduces substantially no speech from person 26 and does introduce speech from person 30, such that person 26 can hear person 30 substantially free of noise from noise sources 14 and 18 and substantially free of his own speech.

Each of the adaptive filter models is preferrably that shown in above incorporated U.S. Pat. No. 4,677,676. Each model adaptively models its respective forward path from its respective input to its respective output on-line without dedicated offline pretraining. Each of models 40 and 48 also adaptively models its respective feedback path from its respective speaker to its respective microphone for both broadband and narrowband noise without dedicated off-line pretraining and without a separate model dedicated solely to the feedback path and pretrained thereto. Each of models 40 and 48, as in above noted incorporated U.S. Pat. No. 4,677,676, adaptively models the feedback path from the respective speaker to the respective microphone as part of the adaptive filter model itself without a separate model dedicated solely to the feedback path and pretrained thereto. Each of models 40 and 48 has a transfer function comprising both zeros and poles to model the forward path and the feedback path, respectively. Each of models 56 and 70 has a transfer function comprising both poles and zeros to adaptively model the pole-zero acoustical transfer function between its respective input microphone and its respective error microphone. Each of models 84 and 100 has a transfer function comprising both poles and zeros to adaptively model the pole-zero acoustical transfer function between its respective output speaker and its respective error microphone. The adaptive filter for all models is preferably accomplished by the use of a recursive least mean square filter, as described in incorporated U.S. Pat. No. 4,677,676. It is also preferred that each of the models 40 and 48 be provided with an auxiliary noise source, such as 140 in incorporated U.S. Pat. No. 4,677,676, introducing auxiliary noise into the respective adaptive filter model which is random and uncorrelated with the noise from the respective noise source to be cancelled.

In one embodiment, noise microphones 20 and 22 are placed at the end of a probe tube in order to avoid placing the microphones directly in a severe environment such as a region of high temperature or high electromagnetic field strength. Alternatively, the signals produced by noise microphones 20 and 22 are obtained from a vibration sensor placed on the respective noise source or obtained from an electrical signal directly associated with the respective noise source, for example a tachometer signal on a machine or a computer generated drive signal on a device such as a magnetic resonance scanner.

The invention includes subcombinations of various of the components and models shown in the drawing. In one embodiment, a single noise source 14 and model 40 are provided, with cancellation via speaker 32 and communication from person 26 via microphone 36. In another embodiment, only models 40 and 56 are provided. In another embodiment, only models 40, 56 and 84 are provided. Various other combinations are provided, as defined in the claims.

It is recognized that various equivalents, alternatives and modifications are possible within the scope of the appended claims.

We claim:

1. An active acoustic attenuation system comprising:
   a zone subject to noise from a noise source;
   a microphone sensing noise from said noise source;
   a speaking location in said zone such that a person at said speaking location is subject to noise from said noise source;
   a speaker introducing sound into said zone at said speaking location;
   an error microphone sensing noise and speech at said speaking location;
   an adaptive filter model adaptively modeling an acoustic path from said noise microphone to said speaking location, said adaptive filter model having a model input from said noise microphone, an error input from said error microphone, and outputting a correction signal to said speaker to introduce cancelling sound at said speaking location to cancel noise from said noise source at said speaking location, such that the output of said error microphone carries a speech signal from said person but not a noise signal from said noise source;
   a second zone spaced from said first mentioned zone;
   a second error microphone sensing speech by a second person at said second zone, the output of said second microphone being supplied to said speaker such that said first mentioned person can hear the speech of said second person.

2. The invention according to claim 1 comprising a second speaker introducing sound into said second zone, and wherein the output of said first mentioned error microphone is supplied to said second speaker such that said second person at said second speaker can hear the speech of said first person, which speech is free of noise from said noise source.

3. The invention according to claim 2 comprising a second adaptive filter model adaptively cancelling speech from said second person in the output of said first error microphone, said second adaptive filter model having a model input from said second error microphone, an output correction signal summed with the output of said first error microphone to provide a sum, and an error input from said sum, said sum also being supplied to said second speaker such that said second person can hear the speech of said first person with the speech of said second person removed.

4. The invention according to claim 3 wherein said output correction signal of said second adaptive filter model is subtractively summed with the output of said first error microphone.

5. An active acoustic attenuation system comprising:
   a zone subject to noise from a noise source;
   a microphone sensing noise from said noise source;
   a speaking location in said zone such that a person at said speaking location is subject to noise from said noise source;
   a speaker introducing sound into said zone at said speaking location;
   an error microphone sensing noise and speech at said speaking location;
   a first adaptive filter model adaptively modeling an acoustic path from said noise microphone to said speaking location, said first adaptive filter model having a model input from said noise microphone, an error input from said error microphone, and outputting a correction signal to said speaker to introduce cancelling sound at said speaking location to cancel noise from said noise source at said speaking location;

a second adaptive filter model adaptively cancelling noise from said noise source in the output of said error microphone, said second adaptive filter model having a model input from said noise microphone, an output correction signal summed with the output of said error microphone to provide a sum, and an error input from said sum.

6. The invention according to claim 5 comprising:
a second zone spaced from said first mentioned zone;
a second error microphone sensing speech by a second person at said second zone, the output of said second error microphone being supplied to said speaker such that said first mentioned person can hear the speech of said second person.

7. The invention according to claim 6 comprising a second speaker introducing sound into said second zone, said sum also being supplied to said second speaker such that said second person at said second zone can hear the speech of said first person.

8. An active acoustic attenuation system comprising:
a first zone subject to noise from a noise source;
a second zone spaced from said first zone;
a microphone sensing noise from said noise source;
a speaking location in said first zone such that a first person at said speaking location is subject to noise from said noise source;
a first speaker introducing sound into said first zone at said speaking location;
a second speaker introducing sound into said second zone;
a first error microphone sensing noise and speech at said speaking location;
a second error microphone sensing speech of a second person at said second zone, the output of said second error microphone being supplied to said first speaker such that said first person can hear the speech of said second person;
a first adaptive filter model adaptively modeling an acoustic path from said noise microphone to said speaking location, said first adaptive filter model having a model input from said noise microphone, an error input from said first error microphone, and outputting a correction signal to said first speaker to introduce cancelling sound at said speaking location to cancel noise from said noise source at said speaking location;
a second adaptive filter model adaptively cancelling noise from said noise source in the output of said first error microphone, said second adaptive filter model having a model input from said noise microphone, an output correction signal summed with the output of said first error microphone to provide a first sum, and an error input from said first sum;
a third adaptive filter model adaptively cancelling speech from said second person in the output of said first error microphone, said third adaptive filter model having a model input from said second error microphone, an output correction signal summed with said first sum to provide a second sum, and an error input from said second sum, said second sum also being supplied to said second speaker such that said second person can hear the speech of said first person with the speech of said second person removed.

9. The invention according to claim 8 comprising a fourth adaptive filter model adaptively cancelling speech from said first person in the output of said second error microphone, said fourth adaptive filter model having a model input from said first error microphone, an output correction signal summed with the output of said second error microphone to provide a third sum, and an error input from said third sum, said third sum also being supplied to said first speaker such that said first person can hear the speech of said second person with the speech of said first person removed.

10. The invention according to claim 9 wherein said third sum is summed with the output correction signal of said first adaptive filter model to provide a fourth sum, said fourth sum being supplied to said first speaker.

11. The invention according to claim 10 wherein:
said third sum is additively summed with said output correction signal of said first adaptive filter model to provide said fourth sum;
said output correction signal of said second adaptive filter model is subtractively summed with said output of said first error microphone to provide said first sum;
said output correction signal of said third adaptive filter model is subtractively summed with said first sum to provide said second sum;
said output correction signal of said fourth adaptive filter model is subtractively summed with said output of said second error microphone to provide said third sum.

12. An active acoustic attenuation system comprising:
a first zone subject to noise from a noise source;
a second zone spaced from said first zone;
a microphone sensing noise from said noise source;
a speaking location in said first zone such that a first person at said speaking location is subject to noise from said noise source;
a first speaker introducing sound into said first zone at said speaking location;
a second speaker introducing sound into said second zone;
a first error microphone sensing noise and speech at said speaking location;
a second error microphone sensing speech of a second person at said second zone, the output of said second error microphone being supplied to said first speaker such that said first person can hear the speech of said second person;
a first adaptive filter model adaptively modeling an acoustic path from said noise microphone to said speaking location, said first adaptive filter model having a model input from said noise microphone, an error input from said first error microphone, and outputting a correction signal to said first speaker to introduce cancelling sound at said speaking location to cancel noise from said noise source at said speaking location;
a second adaptive filter model adaptively cancelling noise from said noise source in the output of said first error microphone, said second adaptive filter model having a model input from said noise microphone, an output correction signal summed with the output of said first error microphone to provide a first sum, and an error input from said first sum, said first sum also being supplied to said second speaker such that said second person can hear the speech of said first person;
a third adaptive filter model adaptively cancelling speech from said first person in the output of said second error microphone, said third adaptive filter model having a model input from said first error microphone, an output correction signal summed with the output of said second error microphone to provide a second sum, and an error input from said second sum, said second sum also being supplied to said first speaker such that said first person can hear the speech of said second person with the speech of said first person removed.

13. An active acoustic attenuation system comprising:
a first zone subject to noise from a first noise source;
a second zone spaced from said first zone and subject to noise from a second noise source;
a first noise microphone sensing noise from said first noise source;
a second noise microphone sensing noise from said second noise source;
a first speaking location in said first zone such that a first person at said first speaking location is subject to said noise from said first noise source;
a second speaking location in said second zone such that a second person at said second speaking location is subject to said noise from said second noise source;
a first speaker introducing sound into said first zone at said first speaking location;
a second speaker introducing sound into said second zone at said second speaking location;
a first error microphone sensing noise and speech at said first speaking location;
a second error microphone sensing noise and speech at said second speaking location;
a first adaptive filter model adaptively modeling a first acoustic path from said first noise microphone to said first speaking location, said first adaptive filter model having a model input from said first noise microphone, an error input from said first error microphone, and outputting a correction signal to said first speaker to introduce cancelling sound at said first speaking location to cancel noise from said first noise source at said first speaking location;
a second adaptive filter model adaptively cancelling noise from said second noise source in the output of said second error microphone, said second adaptive filter model having a model input from said second noise microphone, an output correction signal summed with the output of said second error microphone to provide a first sum, and an error input from said first sum;
said first sum also being supplied to said first speaker such that said first person can hear the speech of said second person.

14. The invention according to claim 13 wherein said first sum is summed with the correction signal output of said first adaptive filter model to provide a second sum which is supplied to said first speaker, said second sum being substantially free of noise from said second noise source as cancelled by said second adaptive filter model, such that said second sum to said first speaker is substantially free of noise from said second noise source but does contain speech from said second person, such that said first speaker cancels noise from said first noise source at said first speaking location and introduces substantially no noise from said second noise source and does introduce speech from said second person such that said first person can hear said second person substantially free of noise from said first and second noise sources.

15. The invention according to claim 14 comprising a third adaptive filter model adaptively cancelling speech from said second person in the output of said first error microphone, said third adaptive filter model having a model input from said second error microphone, an output correction signal summed with the output of said first error microphone to provide a third sum, and an error input from said third sum, said third sum also being supplied to said second speaker such that said second person can hear the speech of said first person with the speech of the second person removed.

16. The invention according to claim 14 comprising a third adaptive filter model adaptively cancelling speech from said first person in the output of said second error microphone, said third adaptive filter model having a model input from said first error microphone, an output correction signal summed with said first sum to provide a third sum, and an error input from said third sum, said third sum also being summed with said output correction signal of said first adaptive filter model to provide said second sum to said first speaker such that said first person can hear the speech of said second person with the speech of said first person removed.

17. The invention according to claim 14 comprising:
a third adaptive filter model adaptively cancelling speech from said second person in the output of said first error microphone, said third adaptive filter model having a model input from said second error microphone, an output correction signal summed with the output of said first error microphone to provide a third sum, and an error input from said third sum, said third sum also being supplied to said second speaker such that said second person can hear the speech of said first person with the speech of the second person removed;
a fourth adaptive filter model adaptively cancelling speech from said first person in the output of said second error microphone, said fourth adaptive filter model having a model input from said first error microphone, an output correction signal summed with said first sum to provide a fourth sum, and an error input from said fourth sum, said fourth sum also being summed with said output correction signal of said first adaptive filter model to provide said second sum input to said first speaker such that said first person can hear the speech of said second person with the speech of said first person removed.

18. An active acoustic attenuation system comprising:
a first zone subject to noise from a first noise source;
a second zone spaced from said first zone;
a noise microphone sensing noise from said first noise source;
a first speaking location in said first zone such that a first person at said first speaking location is subject to said noise from said first noise source;
a second speaking location in said second zone;
a first speaker introducing sound into said first zone at said first speaking location;
a second speaker introducing sound into said second zone at said second speaking location;
an error microphone sensing noise and speech at said first speaking location;
a speech microphone sensing speech by a second person at said second speaking location;
a first adaptive filter model adaptively modeling an acoustic path from said noise microphone to said first speaking location, said first adaptive filter model having a model input from said noise microphone, an error input from said error microphone, and outputting a correction signal to said first speaker to introduce cancelling sound at said first speaking location to cancel noise from said noise source at said first speaking location;

the output of said first error microphone also being supplied to said second speaker such that said second person can hear the speech of said first person;

the output of said speech microphone being supplied to said first speaker such that said first person can hear the speech of said second person;

a second adaptive filter model adaptively cancelling speech from said second person in the output of said error microphone, said second adaptive filter model having a model input from said speech microphone, an output correction signal summed with the output of said error microphone to provide a sum, and an error input from said sum, said sum also being supplied to said second speaker such that said second person can hear the speech of said first person with the speech of said second person removed.

19. The invention according to claim 18 comprising a third adaptive filter model adaptively cancelling speech from said first person in the output of said speech microphone, said third adaptive filter model having a model input from said error microphone, an output correction signal summed with the output of said speech microphone to provide a second sum, and an error input from said second sum, said second sum also being supplied to said first speaker such that said first person can hear the speech of said second person with the speech of said first person removed.

20. The invention according to claim 19 wherein said second sum is summed with the output correction signal of said first adaptive filter model to provide a third sum which is supplied to said first speaker.

21. The invention according to claim 20 wherein:
the model input of said second adaptive filter model is provided by said second sum;
the model input of said third adaptive filter model is provide by said first sum.

22. An active acoustic attenuation system comprising:
a first zone subject to noise from a first noise source;
a second zone spaced from said first zone;
a noise microphone sensing noise from said first noise source;
a first speaking location in said first zone such that a first person at said first speaking location is subject to said noise from said first noise source;
a second speaking location in said second zone;
a first speaker introducing sound into said first zone at said first speaking location;
a second speaker introducing sound into said second zone at said second speaking location;
an error microphone sensing noise and speech at said first speaking location;
a speech microphone sensing speech by a second person at said second speaking location;
a first adaptive filter model adaptively modeling an acoustic path from said noise microphone to said first speaking location, said first adaptive filter model having a model input from said noise microphone, an error input from said error microphone, and outputting a correction signal to said first speaker to introduce cancelling sound at said first speaking location to cancel noise from said noise source at said first speaking location;

the output of said error microphone also being supplied to said second speaker such that said second person can hear the speech of said first person;

the output of said speech microphone being supplied to said first speaker such that said first person can hear the speech of said second person;

a second adaptive filter model adaptively cancelling speech from said first person in the output of said speech microphone, said second adaptive filter model having a model input from said error microphone, an output correction signal summed with the output of said speech microphone to provide a sum, and an error input from said sum, said sum also being supplied to said first speaker such that said first person can hear the speech of said second person with the speech of said first person removed.

23. The invention according to claim 22 wherein said sum is summed with the output correction signal of said first adaptive filter model to provide a second sum which is supplied to said first speaker.

24. An active acoustic attenuation system comprising:
a first zone subject to noise from a first noise source;
a second zone spaced from said first zone and subject to noise from a second noise source;
a first noise microphone sensing noise from said first noise source;
a second noise microphone sensing noise from said second noise source;
a first speaking location in said first zone such that a first person at said first speaking location is subject to said noise from said first noise source;
a second speaking location in said second zone such that a second person at said second speaking location is subject to said noise from said second noise source;
a first speaker introducing sound into said first zone at said first speaking location;
a second speaker introducing sound into said second zone at said second speaking location;
a first error microphone sensing noise and speech at said first speaking location;
a second error microphone sensing noise and speech at said second speaking location;
a first adaptive filter model adaptively modeling a first acoustic path from said first noise microphone to said first speaking location, said first adaptive filter model having a model input from said first noise microphone, an error input from said first error microphone, and outputting a correction signal to said first speaker to introduce cancelling sound at said first speaking location to cancel noise from said first noise source at said first speaking location;
a second adaptive filter model adaptively modeling a second acoustic path from said second noise microphone to said second speaking location, said second adaptive filter model having a model input from said second noise microphone, an error input from said second error microphone, and outputting a correction signal to said second speaker to introduce cancelling sound at said second speaking location to cancel noise from said second noise source at said second speaking location;

the output of said first error microphone also being supplied to said second speaker such that said second person can hear the speech of said first person;

the output of said second error microphone also being supplied to said first speaker such that said first person can hear the speech of said second person.

25. The invention according to claim 24 wherein:

the output of said first error microphone is summed with the correction signal output of said second adaptive filter model to provide a first sum which is supplied to said second speaker, said output of said first error microphone being substantially free of noise from said first noise source as cancelled by said first adaptive filter model, such that said first sum supplied to said second speaker is substantially free of noise from said first noise source but does contain speech from said first person, such that said second speaker cancels noise from said second noise source at said second speaking location and introduces substantially no noise from said first noise source and does introduce speech from said first person such that said second person can hear said first person substantially free of noise from said first and second noise sources;

the output of said second error microphone is summed with the correction signal output of said first adaptive filter model to provide a second sum which is supplied to said first speaker, said output of said second error microphone being substantially free of noise from said second noise source as cancelled by said second adaptive filter model, such that said second sum supplied to said first speaker is substantially free of noise from said second noise source but does contain speech from said second person, such that said first speaker cancels noise from said first noise source at said first speaking location and introduces substantially no noise from said second noise source and does introduce speech from said second person such that said first person can hear said second person substantially free of noise from said first and second noise sources.

26. The invention according to claim 24 comprising a third adaptive filter model adaptively cancelling noise from said first noise source in the output of said first error microphone, said third adaptive filter model having a model input from said first noise microphone, an output correction signal summed with the output of said first error microphone to provide a sum, and an error input from said last mentioned sum.

27. The invention according to claim 24 comprising a third adaptive filter model adaptively cancelling noise from said second noise source in the output of said second error microphone, said third adaptive filter model having a model input from said second noise microphone, an output correction signal summed with the output of said second error microphone to provide a sum, and an error input from said last mentioned sum.

28. The invention according to claim 24 comprising a third adaptive filter model adaptively cancelling speech from said second person in the output of said first error microphone, said third adaptive filter model having a model input from said second error microphone, an output correction signal summed with the output of said first error microphone to provide a sum, and an error input from said last mentioned sum.

29. The invention according to claim 24 comprising a third adaptive filter model adaptively cancelling speech from said first person in the output of said second error microphone, said third adaptive filter model having a model input from said first error microphone, an output correction signal summed with the output of said second error microphone to provide a sum, and an error input from said last mentioned sum.

30. An active acoustic attenuation system comprising:
a first zone subject to noise from a first noise source;
a second zone spaced from said first zone and subject to noise from a second noise source;
a first noise microphone sensing noise from said first noise source;
a second noise microphone sensing noise from said second noise source;
a first speaking location in said first zone such that a first person at said first speaking location is subject to said noise from said first noise source;
a second speaking location in said second zone such that a second person at said second speaking location is subject to said noise from said second noise source;
a first speaker introducing sound into said first zone at said first speaking location;
a second speaker introducing sound into said second zone at said second speaking location;
a first error microphone sensing noise and speech at said first speaking location;
a second error microphone sensing noise and speech at said second speaking location;
a first adaptive filter model adaptively modeling a first acoustic path from said first noise microphone to said first speaking location, said first adaptive filter model having a model input from said first noise microphone, an error input from said first error microphone, and outputting a correction signal to said first speaker to introduce cancelling sound at said first speaking location to cancel noise from said first noise source at said first speaking location;
a second adaptive filter model adaptively modeling a second acoustic path from said second noise microphone to said second speaking location, said second adaptive filter model having a model input from said second noise microphone, an error input from said second error microphone, and outputting a correction signal to said second speaker to introduce cancelling sound at said second speaking location to cancel noise from said second noise source at said second speaking location;
a third adaptive filter model adaptively cancelling noise from said first noise source in the output of said first error microphone, said third adaptive filter model having a model input from said first noise microphone, an output correction signal summed with the output of said first error microphone to provide a first sum, and an error input from said first sum;
said first sum also being supplied to said second speaker such that said second person can hear the speech of said first person;
a fourth adaptive filter model adaptively cancelling noise from said second noise source in the output of said second error microphone, said fourth adaptive filter model having a model input from said second noise microphone, an output correction signal summed with the output of said second error microphone to provide a second sum, and an error input from said second sum;
said second sum also being supplied to said first speaker such that said first person can hear the speech of said second person.

31. The invention according to claim 30 wherein:
said first sum is summed with the correction signal output of said second adaptive filter model to provide a third sum which is supplied to said second speaker, said first sum being substantially free of noise from said first noise source as cancelled by said first and third adaptive filter models, such that said third sum to said second speaker is substantially free of noise from said first noise source but does contain speech from said first person, such that said second speaker cancels noise from said second noise source at said second speaking location and introduces substantially no noise from said first noise source and does introduce speech from said first person such that said second person can hear said first person substantially free of noise from said first and second noise sources;
said second sum is summed with the correction signal output of said first adaptive filter model to provide a fourth sum which is supplied to said first speaker, said fourth sum being substantially free of noise from said second noise source as cancelled by said second and fourth adaptive filter models, such that said fourth sum to said first speaker is substantially free of noise from said second noise source but does contain speech from said second person, such that said first speaker cancels noise from said first noise source at said first speaking location and introduces substantially no noise from said second noise source and does introduce speech from said second person such that said first person can hear said second person substantially free of noise from said first and second noise sources.

32. The invention according to claim 31 wherein:
the output correction signal from said second adaptive filter model is additively summed with said first sum to provide said third sum;
the output correction signal from said first second sum to provide said fourth sum;
the output correction signal from said third adaptive filter is subtractively summed with the output of said first error microphone to provide said first sum;
the output correction signal from said fourth adaptive filter model is subtractively summed with the output of said second error microphone to provide said second sum.

33. An active acoustic attenuation system comprising:
a first zone subject to noise from a first noise source;
a second zone spaced from said first zone and subject to noise from a second noise source;
a first noise microphone sensing noise from said first noise source;
a second noise microphone sensing noise from said second noise source;
a first speaking location in said first zone such that a first person at said first speaking location is subject to said noise from said first noise source;
a second speaking location in said second zone such that a second person at said second speaking location is subject to said noise from said second noise source;
a first speaker introducing sound into said first zone at said first speaking location;
a second speaker introducing sound into said second zone at said second speaking location;
a first error microphone sensing noise and speech at said first speaking location;
a second error microphone sensing noise and speech at said second speaking location;
a first adaptive filter model adaptively modeling a first acoustic path from said first noise microphone to said first speaking location, said first adaptive filter model having a model input from said first noise microphone, an error input from said first error microphone, and outputting a correction signal to said first speaker to introduce cancelling sound at said first speaking location to cancel noise from said first noise source at said first speaking location;
a second adaptive filter model adaptively modeling a second acoustic path from said second noise microphone to said second speaking location, said second adaptive filter model having a model input from said second noise microphone, an error input from said second error microphone, and outputting a correction signal to said second speaker to introduce cancelling sound at said second speaking location to cancel noise from said second noise source at said second speaking location;
a third adaptive filter model adaptively cancelling noise from said first noise source in the output of said first error microphone, said third adaptive filter model having a model input from said first noise microphone, an output correction signal summed with the output of said first error microphone to provide a first sum, and an error input from said first sum;
a fourth adaptive filter model adaptively cancelling noise from said second noise source in the output of said second error microphone, said fourth adaptive filter model having a model input from said second noise microphone, an output correction signal summed with the output of said second error microphone to provide a second sum, and an error input from said second sum;
a fifth adaptive filter model adaptively cancelling speech from said second person in the output of said first error microphone, said fifth adaptive filter model having a model input from said second error microphone, an output correction signal summed with said first sum to provide a third sum, and an error input from said third sum;
said third sum also being supplied to said second speaker such that said second person can hear the speech of said first person;
a sixth adaptive filter model adaptively cancelling speech from said first person in the output of said second error microphone, said sixth adaptive filter model having a model input from said first error microphone, an output correction signal summed with said second sum to provide a fourth sum, and an error input from said fourth sum;
said fourth sum also being supplied to said first speaker such that said first person can hear the speech of said second person.

34. The invention according to claim 39 wherein:
the model input of said fifth adaptive filter model is provided by said fourth sum;
the model input of said sixth adaptive filter model is provided by said third sum.

35. The invention according to claim 34 wherein said third sum is summed with the correction signal output of said second adaptive filter model to provide a fifth sum which is supplied to said second speaker, said fifth sum being substantially free of noise from said first noise source as cancelled by said first and third adaptive filter models, and being substantially free of speech from said second person as cancelled by said fifth adaptive filter model, such that said fifth sum to said second speaker is substantially free of noise from said first noise source and speech from said second person but does contain speech from said first person, such that said second speaker cancels noise from said second noise source at said second speaking location and introduces substantially no noise from said first noise source and introduces substantially no speech from said second person and does introduce speech from said first person such that said second person can hear said first person substantially free of noise from said first and second noise sources and substantially free of his own speech;

said fourth sum is summed with the correction signal output of said first adaptive filter model to provide a sixth sum which is supplied to said first speaker, said sixth sum being substantially free of noise from said second noise source as cancelled by said second and fourth adaptive filter models, and being substantially free of speech from said first person as cancelled by said sixth adaptive filter model, such that said sixth sum to said first speaker is substantially free of noise from said second noise source but does contain speech from said second person, such that said first speaker cancels noise from said first noise source at said first speaking location and introduces substantially no noise from said second noise source and introduces substantially no speech from said first person and does introduce speech from said second person such that said first person can hear said second person substantially free of noise from said first and second noise sources and substantially free of his own speech.

36. The invention according to claim 35 wherein:
the output correction signal from said fifth adaptive filter model is subtractively summed with said first sum to provide said third sum;
the output correction signal from said sixth adaptive filter model is subtractively summed with said second sum to provide said fourth sum.

37. The invention according to claim 36 wherein:
the output correction signal from said third adaptive filter model is subtractively summed with the output of said first error microphone to provide said first sum;
the output correction signal from said fourth adaptive filter model is subtractively summed with the output of said second error microphone to provide said second sum.

38. An active acoustic attenuation system comprising:
a first zone subject to noise from a first noise source;
a second zone spaced from said first zone and subject to noise from a second noise source:
a first noise microphone sensing noise from said first noise source;
a second noise microphone sensing noise from said second noise source;
a first speaking location in said first zone such that a first person at said first speaking location is subject to said noise from said first noise source;
a second speaking location in said second zone such that a second person at said second speaking location is subject to said noise from said second noise source;
a first speaker introducing sound into said first zone at said first speaking location;
a second speaker introducing sound into said second zone at said second speaking location;
a first error microphone sensing noise and speech at said first speaking location;
a second error microphone sensing noise and speech at said second speaking location;
a first adaptive filter model adaptively modeling a first acoustic path from said first noise microphone to said first speaking location, said first adaptive filter model having a model input from said first noise microphone, an error input from said first error microphone, and outputting a correction signal to said first speaker to introduce cancelling sound at said first speaking location to cancel noise from said first noise source at said first speaking location;
a second adaptive filter model adaptively modeling a second acoustic path from said second noise microphone to said second speaking location, said second adaptive filter model having a model input from said second noise microphone, an error input from said second error microphone, and outputting a correction signal to said second speaker to introduce cancelling sound at said second speaking location to cancel noise from said second noise source at said second speaking location;
a third adaptive filter model adaptively cancelling speech from said second person in the output of said first error microphone, said third adaptive filter model having a model input from said second error microphone, an output correction signal summed with the output of said first error microphone to provide a first sum, and an error input from said first sum;
a fourth adaptive filter model adaptively cancelling speech from said first person in the output of said second error microphone, said fourth adaptive filter model having a model input from said first error microphone, an output correction signal summed with the output of said second error microphone to provide a second sum, and an error input from said second sum;
said first sum also being supplied to said second speaker such that said second person can hear the speech of said first person;
said second sum also being supplied to said first speaker such that said first person can hear the speech of said second person.

39. The invention according to claim 38 wherein said first sum is summed with the correction signal output of said second adaptive filter model to provide a third sum which is supplied to said second speaker, said third sum being substantially free of noise from said first noise source as cancelled by said first adaptive filter model, such that said first sum to said second speaker is substantially free of noise from said first noise source but does contain speech from said first person, such that said second speaker cancels noise from said second noise source at said second speaking location and introduces substantially no noise from said first noise source and does introduce speech from said first person such that said second person can hear said first person substantially free of noise from said first and second noise sources;

said second sum is summed with the correction signal output of said first adaptive filter model to provide a fourth sum which is supplied to said first speaker, said fourth sum being substantially free of noise from said second noise source as cancelled by said second adaptive filter model, such that said fourth sum to said first speaker is substantially free of noise from said second noise source but does contain speech from said second person, such that said first speaker cancels noise from said first noise source at said first speaking location and introduces substantially no noise from said second noise source and does introduce speech from said second person such that said first person can hear said second person substantially free of noise from said first and second noise sources.

* * * * *